US010587014B2

(12) United States Patent
Tanii

(10) Patent No.: US 10,587,014 B2
(45) Date of Patent: Mar. 10, 2020

(54) LITHIUM ION SECONDARY BATTERY CHARGING CONTROL METHOD AND CHARGING MECHANISM

(71) Applicant: Maxell Holdings, Ltd., Otokuni-gun, Kyoto (JP)

(72) Inventor: Keiichi Tanii, Osaka (JP)

(73) Assignee: MAXELL HOLDINGS, LTD., Kyoto (JP)

( * ) Notice: Subject to any disclaimer, the term of this patent is extended or adjusted under 35 U.S.C. 154(b) by 360 days.

(21) Appl. No.: 15/506,371

(22) PCT Filed: Dec. 11, 2015

(86) PCT No.: PCT/JP2015/084777
§ 371 (c)(1),
(2) Date: Feb. 24, 2017

(87) PCT Pub. No.: WO2016/104183
PCT Pub. Date: Jun. 30, 2016

(65) Prior Publication Data
US 2017/0279165 A1    Sep. 28, 2017

(30) Foreign Application Priority Data
Dec. 26, 2014    (JP) ................................. 2014-266611

(51) Int. Cl.
*H01M 10/44*      (2006.01)
*G01R 31/392*    (2019.01)
(Continued)

(52) U.S. Cl.
CPC .......... *H01M 10/44* (2013.01); *G01R 31/392* (2019.01); *H01M 10/0525* (2013.01);
(Continued)

(58) Field of Classification Search
CPC ............. H01M 10/0525; H01M 10/44; H01M 10/443; H01M 10/48; H01M 10/486;
(Continued)

(56) References Cited

U.S. PATENT DOCUMENTS 5,691,620 A * 11/1997 Nagai ................... H01M 10/44
320/106
5,723,971 A * 3/1998 Sakai .................... H01M 10/44
320/106
(Continued)

FOREIGN PATENT DOCUMENTS

JP    2001-136673 A    5/2001
JP    2003-17138 A    1/2003
(Continued)

OTHER PUBLICATIONS

Extended European Search Report dated Apr. 18, 2018 in Patent Application No. 15872752.9.
(Continued)

*Primary Examiner* — Drew A Dunn
*Assistant Examiner* — Tessema Kebede
(74) *Attorney, Agent, or Firm* — Birch, Stewart, Kolasch & Birch, LLP

(57) ABSTRACT

A charging control method and a charging mechanism for a lithium ion secondary battery are provided that can determine the life of the lithium ion secondary battery with more accuracy and a simple configuration. A charging control method for a lithium ion secondary battery calculates an integrated value of the number of charged times. The method includes: adding a predetermined value to the integrated value of the number of charged times of the lithium ion secondary battery if both a residual voltage that is a voltage value of the lithium ion secondary battery before the beginning of charging and an elapsed time from the time of the (Continued)

previous charging of the lithium ion secondary battery are not less than predetermined values; and estimating the life of the lithium ion secondary battery based on the integrated value of the number of charged times.

8 Claims, 4 Drawing Sheets

(51) Int. Cl.
*H02J 7/00* (2006.01)
*H01M 10/48* (2006.01)
*H02J 50/80* (2016.01)
*H02J 7/02* (2016.01)
*H02J 50/10* (2016.01)
*H01M 10/0525* (2010.01)
*H02J 7/06* (2006.01)
*H02J 7/14* (2006.01)
*G01R 31/3842* (2019.01)
*G01R 31/382* (2019.01)
*G01R 31/374* (2019.01)

(52) U.S. Cl.
CPC ............. *H01M 10/48* (2013.01); *H02J 7/007* (2013.01); *H02J 7/0021* (2013.01); *H02J 7/0031* (2013.01); *H02J 7/0047* (2013.01); *H02J 7/0072* (2013.01); *H02J 7/0091* (2013.01); *H02J 7/025* (2013.01); *H02J 7/06* (2013.01); *H02J 7/14* (2013.01); *H02J 50/10* (2016.02); *H02J 50/80* (2016.02); *G01R 31/374* (2019.01); *G01R 31/382* (2019.01); *G01R 31/3842* (2019.01); *H01M 10/443* (2013.01); *H01M 10/486* (2013.01); *H02J 7/0024* (2013.01); *Y02T 10/7011* (2013.01); *Y02T 10/7055* (2013.01)

(58) Field of Classification Search
CPC .......... H02J 50/10; H02J 50/80; H02J 7/0047; H02J 7/007; H02J 7/06; H02J 7/14; H02J 7/025; H02J 7/0024; Y02T 10/7011; G01R 31/3613; G01R 31/3679; G01R 31/3624; G01R 31/3832; G01R 31/3842; G01R 31/392; G01R 31/374; G01R 31/382
USPC .................................................. 320/132–137
See application file for complete search history.

(56) References Cited

U.S. PATENT DOCUMENTS

| | | | |
|---|---|---|---|
| 6,275,009 | B1 | 8/2001 | Sakakibara et al. |
| 6,424,123 | B1* | 7/2002 | Odaohhara ........... H02J 7/0073 320/134 |
| 7,211,987 | B2* | 5/2007 | Aoki .................... H01M 10/425 320/134 |
| 7,663,374 | B2* | 2/2010 | Odaohhara ........ G01R 31/3648 324/427 |
| 2003/0076074 | A1* | 4/2003 | Kawai ................... H02J 7/0075 320/136 |
| 2005/0134221 | A1* | 6/2005 | Wanibuchi ............ H02J 7/0075 320/128 |
| 2008/0290833 | A1* | 11/2008 | Hayashi ............ H01M 10/4257 320/106 |
| 2010/0264929 | A1 | 10/2010 | Ugaji et al. |
| 2010/0274509 | A1* | 10/2010 | Nakajima ............. H01M 10/42 702/63 |
| 2014/0039573 | A1 | 2/2014 | Jindra |

FOREIGN PATENT DOCUMENTS

| | | |
|---|---|---|
| JP | 2009-162750 A | 7/2009 |
| JP | 2012-235551 A | 11/2012 |
| JP | 2013-172476 A | 9/2013 |

OTHER PUBLICATIONS

International Search Report for PCT/JP2015/084777 dated Mar. 1, 2016.

* cited by examiner

LITHIUM ION SECONDARY BATTERY CHARGING CONTROL METHOD AND CHARGING MECHANISM

TECHNICAL FIELD

The present disclosure relates to a charging control method for a lithium ion secondary battery and a charging mechanism for a lithium ion secondary battery. In particular, the present invention relates to a charging control method and a charging mechanism for a lithium ion secondary battery that accurately estimate the life of the lithium ion secondary battery from the state of the battery during charging in view of the degree of the degradation of the battery.

BACKGROUND ART

Rechargeable batteries that can be used repeatedly by charging, i.e., so-called secondary batteries have increasingly been developed as power sources of portable electronic equipment. These secondary batteries include a lithium ion secondary battery. The lithium ion secondary battery can be charged and discharged with the use of the movement of lithium ions between a positive electrode and a negative electrode through an electrolyte that is disposed between the positive electrode and the negative electrode. The lithium ion secondary battery is advantageous, e.g., because the energy density is high and the so-called memory effect is small. Therefore, the lithium ion secondary battery has been the mainstream of the secondary battery for a power source to be used in portable electronic equipment, electric vehicles, etc.

On the other hand, the lithium ion secondary battery cannot avoid degradation due to repeated charging and discharging. When the lithium ion secondary battery is charged and discharged at least a certain number of times, the capacity is reduced so that the battery will reach the end of its life. This makes it difficult to use the battery continuously for a long time from then. In particular, when the lithium ion secondary battery is used as a power source of, e.g., a medical assistive device such as a hearing aid, a reduction in the voltage of the battery during the continuous use can cause the operation of the device to stop suddenly, which may lead to a serious situation that poses a potential threat to the safety of the user.

Therefore, there has been a great need for an estimation of the life of the lithium ion secondary battery, i.e., for a more accurate estimation of how much longer the lithium ion secondary battery can be used safely.

In order to meet such a need, conventional methods have been proposed to detect the life or the degree of the degradation of a lithium ion secondary battery. For example, Patent Document 1 proposes a method that includes measuring a plurality of open circuit voltage values of a battery after discharging in different charge/discharge cycle numbers, and estimating the life of the battery from the voltage values. Patent Document 2 proposes a method that includes calculating a substantial capacity of a lithium ion secondary battery when it is charged from a voltage value after a predetermined time has elapsed during the constant-current charging, and comparing the capacity with the initial capacity to estimate the degree of the degradation of the battery.

PRIOR ART DOCUMENTS

Patent Documents

Patent Document 1: JP 2009-162750 A
Patent Document 2: JP 2012-235551 A

DISCLOSURE OF INVENTION

Problem to be Solved by the Invention

The conventional methods for estimating the life of a lithium ion secondary battery disclosed in Patent Documents 1 and 2 would be effective in predicting the future life of the battery from the start to the midpoint of the period of use of the battery. However, in the conventional methods, a predicted value of the life of the battery may vary significantly due to a small error that occurs when a voltage value is measured as basic data for detecting the life of the battery. In particular, the calculated number of times the battery can be used until it dies increases or decreases as the battery approaches the end of its life. This may create confusion for the user.

Moreover, in the conventional methods, a plurality of voltage values are measured and used each time to calculate a predetermined amount for estimating the life of the battery. Therefore, the conventional methods require a circuit configuration that performs a voltage measurement and a calculation to determine the life of the battery. Considering that the lithium ion secondary battery is used as a power source of electronic equipment that needs to be smaller and lighter, the conventional methods are not suitable for the estimation of the life of the lithium ion secondary battery.

The present disclosure is intended to solve the above conventional problems and to provide a charging control method and a charging mechanism for a lithium ion secondary battery that can determine the life of the lithium ion secondary battery with more accuracy and a simple configuration.

Means for Solving Problem

To solve the above problems, a charging control method for a lithium ion secondary battery disclosed in the present application calculates an integrated value of the number of charged times. The method includes: adding a predetermined value to the integrated value of the number of charged times of the lithium ion secondary battery if both a residual voltage that is a voltage value of the lithium ion secondary battery before the beginning of charging and an elapsed time from the time of the previous charging of the lithium ion secondary battery are not less than predetermined values; and estimating the life of the lithium ion secondary battery based on the integrated value of the number of charged times.

A charging mechanism for a lithium ion secondary battery disclosed in the present application includes the following: a charging circuit portion; a voltage detector that detects a voltage of a lithium ion secondary battery to be charged; a memory that stores an integrated value of the number of charged times of the lithium ion secondary battery; a timer that measures an elapsed time from the end of the previous charging of the lithium ion secondary battery; and a control portion that controls the charging circuit portion, the voltage detector, the memory, and the timer. The control portion adds a predetermined value to the integrated value of the number of charged times if both a residual voltage of the lithium ion secondary battery before the beginning of charging, which is detected by the voltage detector, and the elapsed time measured by the timer are not less than predetermined values, and the control portion estimates the life of the lithium ion secondary battery based on the integrated value of the number of charged times.

Effects of the Invention

The charging control method and the charging mechanism for a lithium ion secondary battery disclosed in the present application include: adding a predetermined value to the number of charged times of the lithium ion secondary battery if both the residual voltage before the beginning of charging and the elapsed time from the time of the previous charging are not less than predetermined values; and estimating the life of the lithium ion secondary battery based on the integrated value of the number of charged times. Therefore, the charging can be controlled based on a more accurate estimation of the life of the lithium ion secondary battery that reflects the degradation characteristics of the lithium ion secondary battery.

DESCRIPTION OF THE INVENTION

Figure 1:
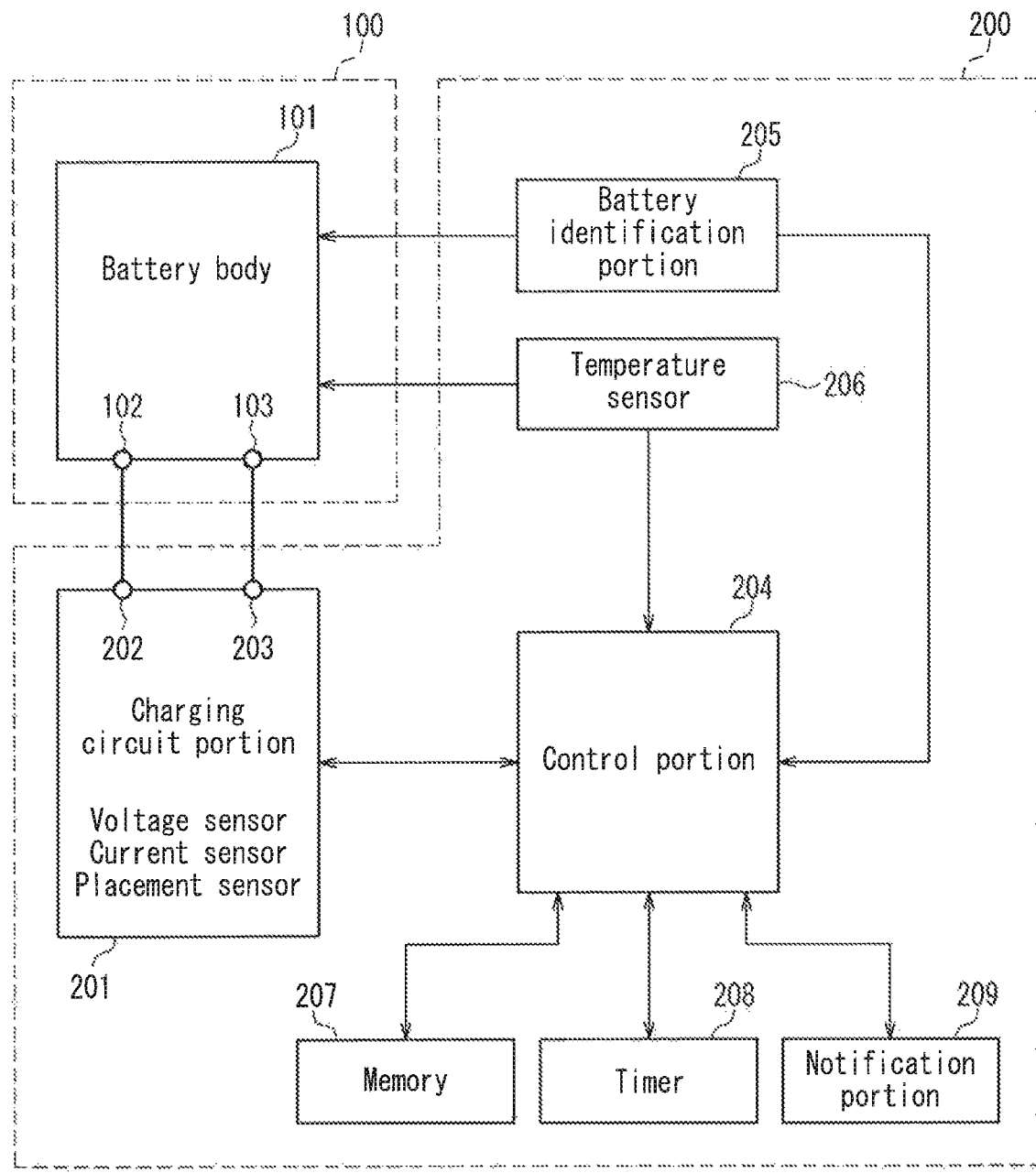
FIG. 1 is a block diagram illustrating a configuration of a charging mechanism for a lithium ion secondary battery.

A charging control method for a lithium ion secondary battery of the present disclosure calculates an integrated value of the number of charged times. The method includes: adding a predetermined value to the integrated value of the number of charged times of the lithium ion secondary battery if both a residual voltage that is a voltage value of the lithium ion secondary battery before the beginning of charging and an elapsed time from the time of the previous charging of the lithium ion secondary battery are not less than predetermined values; and estimating the life of the lithium ion secondary battery based on the integrated value of the number of charged times.

The charging control method for a lithium ion secondary battery of the present disclosure determines the residual voltage before the beginning of charging and the elapsed time from the time of the previous charging of the lithium ion secondary battery to be charged. The charging control method adds a predetermined value to the number of charged times of the lithium ion secondary battery if both the residual voltage and the elapsed time are not less than predetermined values. Therefore, in the charging control method, since the life of the lithium ion secondary battery is estimated based on the integrated value of the number of charged times, it is possible to perform a more accurate estimation of the life that reflects the characteristics of the lithium ion secondary battery and the degradation that is likely to proceed when the battery maintains a high voltage for a long time.

A charging mechanism for a lithium ion secondary battery of the present disclosure includes the following: a charging circuit portion; a voltage detector that detects a voltage of a lithium ion secondary battery to be charged; a memory that stores an integrated value of the number of charged times of the lithium ion secondary battery; a timer that measures an elapsed time from the end of the previous charging of the lithium ion secondary battery; and a control portion that controls the charging circuit portion, the voltage detector, the memory, and the timer. The control portion adds a predetermined value to the integrated value of the number of charged times if both a residual voltage of the lithium ion secondary battery before the beginning of charging, which is detected by the voltage detector, and the elapsed time measured by the timer are not less than predetermined values, and the control portion estimates the life of the lithium ion secondary battery based on the integrated value of the number of charged times.

With this configuration, the charging mechanism for a lithium ion secondary battery of the present disclosure can determine the residual voltage before the beginning of charging, the elapsed time from the time of the previous charging, and the integrated value of the number of charged times of the lithium ion secondary battery to be charged. The charging mechanism adds a predetermined value to the number of charged times of the lithium ion secondary battery if both the residual voltage and the elapsed time are not less than predetermined values, and estimates the life of the lithium ion secondary battery based on the integrated value of the number of charged times. Therefore, the charging mechanism can perform a more accurate estimation of the life that reflects the characteristics of the lithium ion secondary battery and the degradation that is likely to proceed when the battery maintains a high voltage for a long time.

In the charging control mechanism for a lithium ion secondary battery of the present disclosure, it is preferable that the control portion increases the number of charged times by 0.5 if both the residual voltage and the elapsed time are not less than predetermined values. Thus, the degree of the degradation of the lithium ion secondary battery that maintains a high voltage for a long time is correctly reflected in the estimation of the life of the lithium ion secondary battery.

It is preferable that the charging mechanism further includes a temperature detector that detects a temperature of the lithium ion secondary battery, and that the control portion increases the number of charged times by 1 if the temperature of the lithium ion secondary battery during charging is not less than a predetermined temperature. Thus, the degradation of the lithium ion secondary battery that is exposed to a high temperature during charging is correctly reflected in the estimation of the life of the lithium ion secondary battery.

It is preferable that the control portion notifies a user that the lithium ion secondary battery is approaching the end of its life if the integrated value of the number of charged times is more than a predetermined warning value. This can encourage the user to prepare for the replacement of the lithium ion secondary battery.

It is preferable that the control portion notifies a user that the lithium ion secondary battery reaches the end of its life and does not perform charging if the integrated value of the number of charged times is more than a predetermined threshold value. This can avoid the risk of continuing to use the lithium ion secondary battery that has reached the end of its life.

In the charging control mechanism for a lithium ion secondary battery of the present disclosure, it is preferable that when using a device powered by the lithium ion secondary battery and a charger for charging the lithium ion secondary battery, at least a part of the voltage detector, at least a part of the memory, and at least a part of the control portion are arranged along with the lithium ion secondary battery in the device, that portions of the charging mechanism other than the portions arranged in the device are arranged in the charger, and that information can be exchanged between the device and the charger. This configuration can provide a smaller portable electronic equipment with the charging mechanism of the present disclosure.

In this case, it is preferable that the device is a hearing aid, and electric power is supplied in a noncontact manner between the hearing aid and the charger.

Hereinafter, embodiments of a charging control method for a lithium ion secondary battery and a charging mechanism for a lithium ion secondary battery according to the present disclosure will be described with reference to the drawings.

Embodiment

FIG. 1 is a block diagram illustrating a schematic configuration of a charging mechanism for a lithium ion secondary battery of this embodiment.

FIG. 1 functionally illustrates components of the charging mechanism and the correlation between the components. In FIG. 1, each block does not represent a physically independent member. Therefore, in some cases, one block may be separately configured as two different members. In other cases, two or more blocks may be configured as one member.

As illustrated in FIG. 1, a charging mechanism 200 for a lithium ion secondary battery of this embodiment has the functions of charging a lithium ion secondary battery 100 and estimating the life of the lithium ion secondary battery 100 during the charging.

In this embodiment, the lithium ion secondary battery 100 includes a positive electrode, a negative electrode, and an electrolyte that is disposed between the positive electrode and the negative electrode. Moreover, the lithium ion secondary battery 100 includes a battery body 101, and a plus (+) terminal 102 and a minus (−) terminal 103 that are connected to the battery body 101. The battery body 101 is a secondary battery cell and can be charged and discharged with the use of the movement of lithium ions between the positive electrode and the negative electrode through the electrolyte.

A battery pack used as a power source of portable electronic equipment may include various additional circuits other than a battery body. The additional circuits may be, e.g., a control circuit for controlling the charging and discharging of the battery body, a battery protection circuit, a conversion circuit of an output voltage, and a remaining battery level detection circuit. These components are incorporated along with the battery body into the battery pack so that they perform additional functions during the charging and discharging of the battery body. In this embodiment, such additional components are identified as components in the charging mechanism 200 for the lithium ion secondary battery 100. Therefore, the battery pack including an additional circuit configuration other than the battery body does not correspond to the lithium ion secondary battery 100 of this embodiment.

The possible shape of the lithium ion secondary battery 100 of this embodiment is not particularly limited. The lithium ion secondary battery 100 may have various shapes including: a thin, substantially rectangular parallelepiped, which is often used for portable electronic equipment; a cylindrical shape, with which the battery is interchangeable with a dry cell; a box shape, which is used for a large-capacity battery; and a coin (button) shape, which is used for a small device such as a hearing aid.

The charging mechanism 200 for a lithium ion secondary battery of this embodiment includes a charging circuit portion 201, a control portion 204, a battery identification portion 205, a temperature sensor 206, a memory 207, a timer 208, and a notification portion 209.

The charging circuit portion 201 is a circuit block having a circuit configuration for charging the lithium ion secondary battery 100. The charging circuit portion 201 includes a charging power source (not shown) and two charging terminals 202 and 203. The charging terminals 202 and 203 are connected to the plus (+) terminal 102 and the minus (−) terminal 103 of the lithium ion secondary battery 100, respectively.

The lithium ion secondary battery 100 is generally charged in accordance with a charging program, which performs constant-current charge and then constant-voltage charge. If the battery voltage at the beginning of the charging is lower than a predetermined value, the battery is precharged at a low voltage to protect the battery from degradation. For the execution of the charging program, the charging circuit portion 201 further includes a voltage sensor and a current sensor. The voltage sensor detects a voltage value of the lithium ion secondary battery 100 via the charging terminals 202, 203. The current sensor detects a current value that is supplied to the lithium ion secondary battery 100 from the charging terminals 202, 203. In this regard, the charging circuit portion 201 also serves as a voltage detector for detecting a voltage value of the lithium ion secondary battery 100.

The control portion 204 controls the execution of the charging program based on the voltage value and the current value that are detected by the voltage sensor and the current sensor of the charging circuit portion 201.

The charging mechanism 200 can detect whether or not the lithium ion secondary battery 100 is properly connected to the charging mechanism 200. One of the methods for detecting the connection between the lithium ion secondary battery 100 and the charging mechanism 200 may be to detect the application of a predetermined voltage to the charging terminals 202, 203 of the charging circuit portion 201 from the outside. Moreover, the connection between the lithium ion secondary battery 100 and the charging mechanism 200 can be detected by detecting the flow of a current between the charging terminals 202, 203 of the charging circuit portion 201. In this regard, the charging circuit portion 201 functions as a placement sensor for detecting the placement of the battery.

The detection of the proper placement of the lithium ion secondary battery 100 using the charging circuit portion 201 is also effective in finding an abnormal condition in which the charging cannot be performed normally, although the lithium ion secondary battery 100 is physically placed. The abnormal condition may be caused, e.g., when the terminals 102, 103 of the lithium ion secondary battery 100 are short-circuited by fine metal fragments or the like, or when the terminals 102, 103 of the lithium ion secondary battery 100 are insulated from the charging terminals 202, 203 in the charging mechanism 200 due to the presence of foreign matter between the terminals 102, 103 and the charging terminals 202, 203.

The connection between the lithium ion secondary battery 100 and the charging mechanism 200 can also be detected by a mechanical method. For example, a detection pin (not shown) is provided in a portion of the charging mechanism 200 where the lithium ion secondary battery 100 is to be placed. The mechanical method detects the pressure applied to the detection pin by the lithium ion secondary battery 100 while it is being placed. Moreover, an optical or electromagnetic device may be used to detect the placement of the lithium ion secondary battery 100 in a predetermined position of the charging mechanism 200.

The control portion 204 in the charging mechanism 200 estimates the life of the lithium ion secondary battery 100 at the same time as controlling the charging of the lithium ion secondary battery 100.

More specifically, the control portion 204 receives from the charging circuit portion 201, the battery identification portion 205, the temperature sensor 206, and the memory 207 a variety of information about the lithium ion secondary battery 100 to be charged. Then, based on the elapsed time information concerning the charging interval of the lithium ion secondary battery 100, which is obtained from the timer 208, the control portion 204 updates the integrated value of the number of charged times, i.e., an indicator for estimating the life of the lithium ion secondary battery 100 to be charged.

Further, based on the integrated value of the number of charged times, i.e., the indicator for estimating the life of the lithium ion secondary battery 100 to be charged, if it is determined that the lithium ion secondary battery 100 is approaching the end of its life, the control portion 204 notifies a user of this fact through the notification portion 209. If it is determined that the lithium ion secondary battery 100 has already reached the end of its life, the control portion 204 notifies the user of this fact through the notification portion 209 and stops the charging.

On the other hand, if it is determined that the lithium ion secondary battery 100 is still able to be used, the control portion 204 controls the charging circuit portion 201 so as to charge the lithium ion secondary battery 100 in accordance with a predetermined charging program. In this case, the control portion 204 appropriately refers to the temperature information from the temperature sensor 206 for the execution of the charging program.

After the charging is completed, the control portion 204 notifies the user of the completion of the charging through the notification portion 209. Even if the lithium ion secondary battery 100 cannot be charged normally due to abnormalities during the charging, the control portion 204 notifies the user of this fact through the notification portion 209.

The battery identification portion 205 acquires the identification information of the lithium ion secondary battery 100 to be charged, which has been placed on the charging mechanism 200. The identification information of the lithium ion secondary battery 100 can be acquired by an optical method. For example, the battery identification portion 205 may include an optical detection means to read the information such as a bar code attached to the surface of the lithium ion secondary battery 100. In addition to the optical method, an electromagnetic method or a mechanical method using a contact pin can also be used. Further, when the battery identification portion 205 includes an information transmission means such as a wire/wireless communication means that allows information to be exchanged between the charging mechanism 200 and the lithium ion secondary battery 100, the information transmission means (which constitutes a part of the battery identification portion 205) can be used to read the ID information that is recorded in the lithium ion secondary battery 100.

When the battery identification portion 205 detects the placement of the lithium ion secondary battery 100 on the charging mechanism 200, the charging circuit portion 201 does not need to function as the placement sensor. Once the battery identification portion 205 has properly acquired the identification information of the lithium ion secondary battery 100 placed on the charging mechanism 200, the information itself can be used to confirm the placement of the lithium ion secondary battery 100 on the charging mechanism 200.

If the charging mechanism 200 is inseparable from the lithium ion secondary battery 100, or if the lithium ion secondary battery 100 to be charged by the charging mechanism 200 is always the same, the battery identification portion 205 may not be provided.

The temperature sensor 206 is a temperature detector that directly or indirectly detects the temperature of the lithium ion secondary battery 100 placed on the charging mechanism 200. The temperature information of the lithium ion secondary battery 100 detected by the temperature sensor 206 is used in the control portion 204 to determine the life of the lithium ion secondary battery 100 and/or to execute the charging program of the lithium ion secondary battery 100. The temperature sensor 206 is not necessarily required in the charging mechanism 200 of this embodiment. The temperature sensor 206 can be eliminated when the control portion 204 controls only the operation that does not need the temperature information of the lithium ion secondary battery 100 to be charged.

The temperature sensor 206 may measure the temperature of the lithium ion secondary battery 100 either directly or indirectly. The temperature sensor 206 may be any new or existing means that is capable of measuring the temperature of an object, including, e.g., electrical elements such as a thermocouple and a thermistor, and optical elements such as an optical thermo-sensor.

A variety of information about the lithium ion secondary battery 100 to be charged is recorded in the memory 207 by the control portion 204. The memory 207 can provide the recorded information to the control portion 204. In the charging mechanism 200, the integrated value of the number of charged times is used as the indicator for estimating the life of the lithium ion secondary battery 100 to be charged. Therefore, the integrated value of the number of charged times that has been updated in the previous charging of the lithium ion secondary battery 100 is associated with the battery identification information of the lithium ion secondary battery 100 and stored in the memory 207. The control portion 204 reads out the integrated value of the number of charged times of the lithium ion secondary battery 100 stored in the memory 207, and determines the life of the lithium ion secondary battery 100. Subsequently, the control portion 204 performs the charging of the lithium ion secondary battery 100, and records the newly updated integrated value of the number of charged times in conjunction with the battery identification information in the memory 207.

The memory 207 in the charging mechanism 200 may be any memory device or storage medium that is capable of updating and recording the information appropriately.

When there is not a one-to-one correspondence between the lithium ion secondary battery 100 and the charging mechanism 200, and the lithium ion secondary battery 100 may be charged by a different charging mechanism, the memory 207 is preferably provided along with the lithium ion secondary battery 100 in a battery pack or a device powered by the lithium ion secondary battery 100. Thus, even if the lithium ion secondary battery 100 is charged by a different charger, the integrated value of the number of charged times can be updated as the indicator for estimating the life of the lithium ion secondary battery 100.

The memory 207 may also store a variety of other progress information of the lithium ion secondary battery 100 to be charged. Examples of the progress information include the manufacturing information, the use history, the specification such as charge voltage and charge current properties, the error log during the charging, and the process of changes in temperature during the charging. The control portion 204 can refer to any of the above information for the execution of the charging program.

The timer 208 in the charging mechanism 200 measures an elapsed time as a charging interval, i.e., the period of time between the previous charging and the present charging of the lithium ion secondary battery 100 to be charged.

Based on the elapsed time from the time of the previous charging of the lithium ion secondary battery 100, which is measured by the timer 208, the control portion 204 decides whether to add a predetermined value to the number of charged times (i.e., the indicator of the life of the lithium ion secondary battery 100) or to keep the number of charged times unchanged.

The timer 208 can be provided as a timer counter that is located in the charging mechanism 200 and always counts an elapsed time. The timer 208 can also be provided as a method that includes acquiring, e.g., current time information for an atomic clock every time the lithium ion secondary battery 100 is charged, and measuring an elapsed time as a charging interval based on the acquired current time information.

The notification portion 209 notifies a user of the various conditions such as the placement and life of the lithium ion secondary battery 100, which are detected by the control portion 204, the progress of the charging operation by the charging mechanism 200, and the occurrence of an abnormality.

The notification portion 209 may use various means such as an information display means that appeals to the eyes of a user and a voice means that appeals to the ear of a user. For example, the information display means may include one or more LED lamps and display devices such as a liquid crystal panel and an EL panel, and the voice means may include a buzzer, electronic sounds, and a synthetic speech.

In the charging mechanism 200, the notification portion 209 is not an essential component and may be eliminated if a user is not notified.

Next, a method for estimating the life of the lithium ion secondary battery 100 to be charged, which is performed by the control portion 204 in the charging mechanism 200 of this embodiment, will be described.

In the charging mechanism 200, the control portion 204 increases the number of charged times by a predetermined value if a residual voltage V that is a voltage value of the lithium ion secondary battery 100 at the beginning of the charging is not less than a predetermined voltage $V_0$, and an elapsed time t that is a charging interval of the lithium ion secondary battery 100 is not less than a predetermined period of time $t_0$.

The lithium ion secondary battery is degraded with increasing the number of charged times. In addition, the charge and discharge characteristics of the lithium ion secondary battery are also degraded when the battery maintains a high charging voltage for a long time. In the charging method for the lithium ion secondary battery of this embodiment, if a sustaining voltage V of the lithium ion secondary battery at the beginning of the charging is not less than a predetermined voltage $V_0$, and the elapsed time t of the lithium ion secondary battery is not less than a predetermined period of time $t_0$, the number of charged times (i.e., the indicator of degradation) is increased based on the judgment that the degradation of the lithium ion secondary battery has proceeded to some extent. Thus, the charting mechanism 200 can determine the life of the lithium ion secondary battery with more accuracy by correctly reflecting the factors in the degradation of the charge and discharge characteristics inherent in the lithium ion secondary battery.

Hereinafter, the way of determining the life of the lithium ion secondary battery by the charging mechanism of this embodiment will be described in detail when the lithium ion secondary battery 100 is a coin type lithium ion secondary battery that is used as a power source of a hearing aid.

The coin type lithium ion secondary battery is CLB2030 (product name) manufactured by Hitachi Maxell, Ltd. and has the following specifications: charging voltage 4.2 V; discharge cut-off voltage 3.0 V; capacity maintenance ratio 90% after 500 charge cycles; and charging temperature 0° C. to +45° C. Therefore, a threshold value of the number of times the battery is charged before the end of its life is set to 500 times. Using the charging mechanism 200 of this embodiment, the control portion 204 increases the number of charged times CT (i.e., the indicator of the battery life) by +1 every time the battery is charged, and records the results in the memory 207. In this case, the control portion 204 increases the number of charged times CT by +0.5 if the sustaining voltage V of the coin type lithium ion secondary battery at the beginning of the charging is not less than a predetermined voltage $V_0$ of 3.9 V, which corresponds to about 93% of the charge rated voltage, and the elapsed time t from the time of the previous charging is not less than a predetermined period of time to of 12 hours. Thus, the charging mechanism 200 can control the life of the lithium ion secondary battery by taking into account not only the number of times the battery is charged, but also the degradation factors inherent in the lithium ion secondary battery such as the length of time over which the battery maintains a high voltage and accelerates the degradation.

The charging mechanism 200 also deals with a temperature rise during the charging, which is considered as a degradation factor in the lithium ion secondary battery. If a battery temperature T is raised to a predetermined temperature $T_0$ of 40° C. or more during the charging of the lithium ion secondary battery, the control portion 204 increases the number of charged times CT by +1. In this manner, even though the battery temperature T is not more than 45° C., at which the charging is not regarded as abnormal and will not be stopped by the control portion 204, the charging mechanism 200 can determine the life of the lithium ion secondary battery by correctly reflecting the temperature rise during the charging (degradation factor) that may reduce the life of the lithium ion secondary battery.

When the control portion 204 determines the life of the lithium ion secondary battery to be charged, it is possible to give a user a warning that the lithium ion secondary battery is approaching the end of its life before notifying the user that the lithium ion secondary battery is at the end of its life. For example, the charging mechanism 200 may be configured so that the notification portion 209 gives a user a warning that the lithium ion secondary battery is approaching the end of its life if the number of charged times comes close to, but does not reach, 500 times, which is defined as the threshold value. Specifically, e.g., a warning value may be set to 450 times, which is 90% of 500 times indicating the end of the battery life, and the warning may be issued if the number of charged times is more than the warning value. This allows the user to know in advance that the lithium ion secondary battery is about to reach the end of its life. In response to the warning, e.g., the user can prepare an alternative lithium ion secondary battery. Moreover, the user may be notified in advance of the life of the lithium ion secondary battery to be charged by using, e.g., a simple indicator that tells the user the remaining life of the battery after each charging.

As described above, the charging mechanism 200 can determine the life of the lithium ion secondary battery with more accuracy, since the number of charged times is calculated by taking into account not only the actual number of times the battery is charged, but also the number of times the battery maintains a high voltage for a long time and the number of times the battery temperature becomes higher during the charging. If the number of charged times CT thus counted reaches a predetermined threshold value of 500 times, the control portion 204 does not perform the charging of the lithium ion secondary battery and notifies the user that the lithium ion secondary battery is at the end of its life through the notification portion 209, which serves as a display portion such as an LED lamp.

In the above description, the sustaining voltage $V_0$ is used as a measure of the degradation of the lithium ion secondary battery and is set to 3.9 V, which corresponds to 93% of the charge rated voltage. However, the sustaining voltage $V_0$ as a measure of the degradation is not limited to 3.9 V. The sustaining voltage $V_0$ as a measure of the degradation should be appropriately set in accordance with the degradation characteristics that depend on, e.g., the capacity, the size, and the materials of the positive electrode, the negative electrode, and the electrolyte of the lithium ion secondary battery to be charged by the charging mechanism. For example, the sustaining voltage $V_0$ as a measure of the degradation is preferably not less than 90% of the charge rated voltage.

In this embodiment, the reference value to of the elapsed time for which the lithium ion secondary battery maintains a high voltage is set to 12 hours. Similarly to the sustaining voltage $V_0$ as a measure of the degradation, the reference value to should be appropriately set in accordance with the degradation characteristics of the lithium ion secondary battery whose life is determined. The reference value to is generally not less than 12 hours in terms of practical use.

In this embodiment, the reference value $T_0$ of the temperature rise during the charging, which is a degradation factor in the lithium ion secondary battery, is set to 40° C. The reference value $T_0$ should be appropriately set in accordance with the degradation characteristics of the lithium ion secondary battery whose life is determined. However, the reference value $T_0$ of the temperature rise during the charging is likely to vary depending on the surrounding environment of the lithium ion secondary battery, i.e., depending on what state the battery body is in during the charging. Therefore, it is preferable that the reference value $T_0$ is also set in view of other factors such as the materials of the members surrounding the battery body, the number of the battery bodies that are adjacent to each other, and whether or not circuit components that can be heat sources are arranged in the vicinity of the lithium ion secondary battery.

In this embodiment, an increment of the number of charged times is +0.5 when the lithium ion secondary battery maintains a high voltage for a long time. Moreover, an increment of the number of charged times is +1.0 when the battery temperature is raised to a predetermined temperature or more during the charging. These values should be appropriately set in accordance with the various characteristics of the lithium ion secondary battery whose life is determined. The number of charged times is compared with a predetermined number of times (e.g., 500 times in this embodiment) to determine whether or not the lithium ion secondary battery reaches the end of its life. Therefore, it is not important to specify the number of charged times as a numeric value with many decimal places. For actual operation, the number of charged times is preferably expressed as an indicator in increments of 1 or 0.5. This results in a sufficiently accurate estimation of the life of the lithium ion secondary battery.

Next, a charging operation of the lithium ion secondary battery performed by the charging mechanism of this embodiment will be described.

Figure 2:
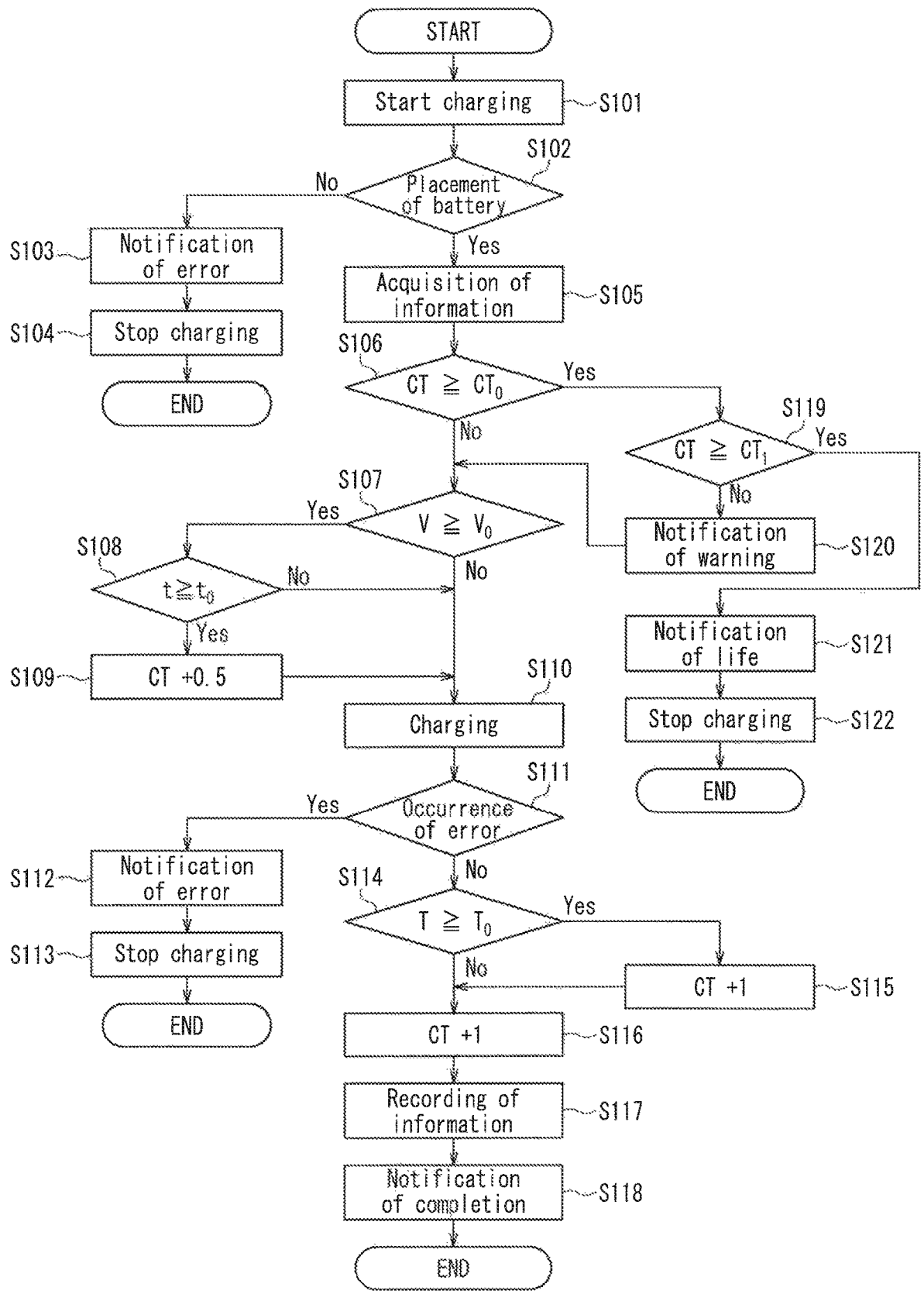
FIG. 2 is a flow chart for explaining a charging operation of a lithium ion secondary battery.

FIG. 2 is a flow chart for explaining a charging operation of the lithium ion secondary battery performed by the charging mechanism of this embodiment, and an adjustment operation of an indicator to determine the life of the lithium ion secondary battery performed at the same time as the charging operation. In the flow chart of FIG. 2, the charging mechanism 200 of this embodiment is used (see FIG. 1), and the components are denoted by the same reference numerals as those illustrated in FIG. 1.

As illustrated in FIG. 2, in the charging operation performed by the charging mechanism 200 of this embodiment, first, a user presses down, e.g., a charge start button of a charger to start a charging operation of a lithium ion secondary battery 100 (step S101).

When the charging operation is started, the control portion 204 determines whether or not the lithium ion secondary battery 100 to be charged is properly placed in a predetermined position of the charging mechanism 200, based on a signal from, e.g., the charging circuit portion 201 or the battery identification portion 205 (step S102).

If the proper placement of the lithium ion secondary battery 100 is not detected ("No" in the step S102), the control portion 204 notifies the user of an error indicating that the battery is not properly placed through the notification portion 209 (step S103), and then stops the charging operation (step S104).

On the other hand, if the proper placement of the lithium ion secondary battery 100 is detected ("Yes" in the step S102), the control portion 204 acquires from the battery identification portion 205 the battery identification information such as ID data of the lithium ion secondary battery 100 that has been placed. The control portion 204 uses the acquired ID data to retrieve the number of charged times CT of the lithium ion secondary battery 100 to be charged from the memory 207 (step S105). When the number of charged times CT of the lithium ion secondary battery 100 to be charged is stored in a memory provided in the lithium ion secondary battery 100, the control portion 204 acquires the number of charged times CT along with the battery identification information from the battery identification portion 205.

Next, the control portion 204 determines whether or not the number of charged times CT (i.e., the indicator of the battery life) of the lithium ion secondary battery 100 is not less than a warning value $CT_0$ (step S106). The warning value $CT_0$ is a value at which the user should be warned that the number of charged times CT comes close to a predetermined number of times that is defined as the end of the life of the lithium ion secondary battery 100.

If the number of charged times CT is less than the warning value $CT_0$ ("No" in the step S106), the control portion 204 determines that the lithium ion secondary battery 100 has not reached the end of its life yet, and there is no need to give the user a warning. Thus, the control portion 204 starts the charging operation in accordance with a predetermined charging program.

The control portion 204 acquires from the charging circuit portion 201 a sustaining voltage V that is a voltage value of the lithium ion secondary battery 100 before the beginning the charging program. Then, the control portion 204 determines whether or not the sustaining voltage V is not less than a predetermined reference voltage $V_0$ (step S107).

If the sustaining voltage V is not less than the reference voltage $V_0$ ("Yes" in the step S107), the control portion 204 proceeds to a step S108 and acquires from the timer 208 an elapsed time t from the time of the previous charging of the lithium ion secondary battery 100 to be charged. If the elapsed time t is not less than a predetermined period of time to ("Yes" in the step S108), the control portion 204 proceeds to a step S109 and adds +0.5 to the value CT before the beginning of the charging, thereby obtaining the number of charged times CT of the lithium ion secondary battery 100.

Subsequently, the lithium ion secondary battery 100 is charged in accordance with the predetermined procedure of the charging program (step S110).

On the other hand, if the sustaining voltage V is less than the reference voltage $V_0$ ("No" in the step S107), or if the elapsed time t is less than the predetermined period of time to ("No" in the step S108), the control portion 204 performs the charging of the lithium ion secondary battery 100 in accordance with the predetermined procedure of the charging program, while keeping the number of charged times CT unchanged (step S110).

Like the charging program of the coin type lithium ion secondary battery for a hearing aid, the charging program performed by the charging mechanism of this embodiment may include pre-charge as needed, followed by constant-current charge and constant-voltage charge in this order. Based on, e.g., the voltage value or the charging current value of the lithium ion secondary battery 100, obtained from the charging circuit portion 201, and the temperature data of the lithium ion secondary battery 100, obtained from the temperature sensor 206, the control portion 204 controls the charging circuit portion 201 so as to charge the lithium ion secondary battery 100 in accordance with the predetermined program.

If any errors occur in the execution of the charging program ("Yes" in a step S111), the control portion 204 notifies the user of a charging error through the notification portion 209 (step S112) and stops the charging operation (step S113). In this case, such errors may be due to the following causes; (a) the temperature of the lithium ion secondary battery 100 is abnormally high during the charging operation in accordance with the charging program; (b) the voltage value of the lithium ion secondary battery 100 is not increased even after a certain charging time has passed; and (c) the charging current is much larger than a set value.

If the charging is finished without any abnormalities ("No" in the step S111), the control portion 204 determines whether or not the temperature of the lithium ion secondary battery 100 is not less than a predetermined reference temperature $T_0$ during the charging operation, although the temperature is not high enough to stop the charging operation due to a charging error, based on the temperature data of the lithium ion secondary battery 100 during the charging, obtained from the temperature sensor 206 (step S114).

If the temperature of the lithium ion secondary battery 100 during the charging is not less than the reference temperature $T_0$ ("Yes" in the step S114), the number of charged times CT (i.e., the indicator of the battery life) is increased by 1 (step S115).

Thus, the indicator of the battery life of the lithium ion secondary battery 100 can reflect the temperature rise during the charging that may lead to the degradation of the lithium ion secondary battery 100.

As described in the above example of the coin type lithium ion secondary battery, a charging error occurs when the battery temperature is not less than 45° C. The battery temperature of not less than the reference temperature $T_0$ ("Yes" in the step S114) does not cause abnormal charging, but may adversely affect the battery characteristics. Such an unusual condition is observed when the reference temperature $T_0$ is in the range of 40° C. to 45° C. This temperature range is the same as that of the coin type lithium ion secondary battery. Moreover, the control portion 204 may determine that the temperature of the lithium ion secondary battery 100 during the charging is not less than the predetermined reference temperature $T_0$ based on the premise that the battery temperature continues to be not less than the reference temperature $T_0$ for, e.g., 10 minutes. Thus, the decision in the control portion 204 can be made more accurate by using a criterion to confirm the length of time over which the battery temperature is not less than the reference temperature $T_0$.

As thus far described, the predetermined charging program is finished. Therefore, the control portion 204 increases the number of charged times CT of the lithium ion secondary battery 100 by +1 (step S116).

In this embodiment, the number of charged times CT of the lithium ion secondary battery 100 is increased by +1 after the charging program is completely finished. However, if there is no sufficient time for charging, or the charging is forcefully terminated in the middle of the operation due to some unexpected reasons, the number of charged times CT will not be counted. Therefore, the control portion 204 can increase the number of charged times CT by 1 (step S116 in FIG. 2) after the charging state continues for some time, e.g., after 30 minutes have passed from the beginning of the charging, rather than after the charging program is completely finished.

After the completion of the charging program, the number of charged times CT has been increased by 1 and thus matches with the current state of the lithium ion secondary battery 100. The control portion 204 records the resulting number of charged times CT in the memory 207 as an accurate indicator to determine the life of the lithium ion secondary battery 100 at that time (step S117). Consequently, the number of charged times of the lithium ion secondary battery 100 to be charged is stored as a correct value that matches with the current state, and the life of the lithium ion secondary battery 100 will be determined based on this value during the next charging.

The control portion 204 notifies the user of the completion of the charging (step S118), so that the charging operation is ended.

If the control portion 204 determines that the number of charged times CT of the lithium ion secondary battery 100 at the beginning of the charting is more than the warning value $CT_0$ ("Yes" in the step S106), the control portion 204 again determines whether or not the number of charged times CT is more than a threshold value $CT_1$ (step S119). The threshold value $CT_1$ represents the end of the life of the lithium ion secondary battery 100, while the warning value $CT_0$ indicates that the lithium ion secondary battery 100 is about to reach the end of its life.

If the number of charged times CT is more than the warning value $CT_0$ and less than the threshold value $CT_1$, the control portion 204 gives the user a warning that the lithium ion secondary battery 100 is approaching the end of its life through the notification portion 209 (step S120).

Then, the control portion 204 proceeds to the step S107 and performs the charging operation in accordance with the charging program.

If the number of charged times CT is more than the threshold value $CT_1$ ("Yes" in the step S119), the control portion 204 notifies the user that the lithium ion secondary battery 100 reaches the end of its life, and the intended battery characteristics cannot be achieved by further charging (step S121), and then stops the charging operation (step S122).

As is evident from the above description, in the charging operation according to the flow chart in FIG. 2, even if the number of charged times CT is less than the threshold value $CT_1$ at the time of the step S106, which is immediately after the start of the charging operation, the number of charged times CT may exceed the threshold value $CT_1$ at the time of finishing the charging, depending on the state of the lithium ion secondary battery 100 during the charging. However, in general, the degradation of the lithium ion secondary battery does not proceed significantly only because the number of charged times varies by about several times. Therefore, the lithium ion secondary battery that is charged and used in the manner as illustrated in FIG. 2 may not pose a large problem unless the number of charged times CT at the beginning of the charging is more than the threshold value $CT_1$. In view of such an error in the number of charged times CT, the threshold value $CT_1$ may be set to a value that is about several times smaller than the design threshold value.

The charging mechanism for a lithium ion secondary battery of this embodiment determines the effects on the life of the lithium ion secondary battery during the charging operation, and appropriately updates the number of charged times that is the indicator of the battery life. Thus, the charging mechanism can make a more accurate decision on the life of the lithium ion secondary battery to be charged.

As described above, the arrangement of the component blocks constituting the charging mechanism 200 (see FIG. 1) relative to the device configuration may differ depending on the specific forms of electronic equipment that uses the lithium ion secondary battery 100 as a power source and a charging apparatus that charges the lithium ion secondary battery 100. Hereinafter, examples of the arrangement of the charging mechanism 200 in a specific device will be described.

Figure 3:
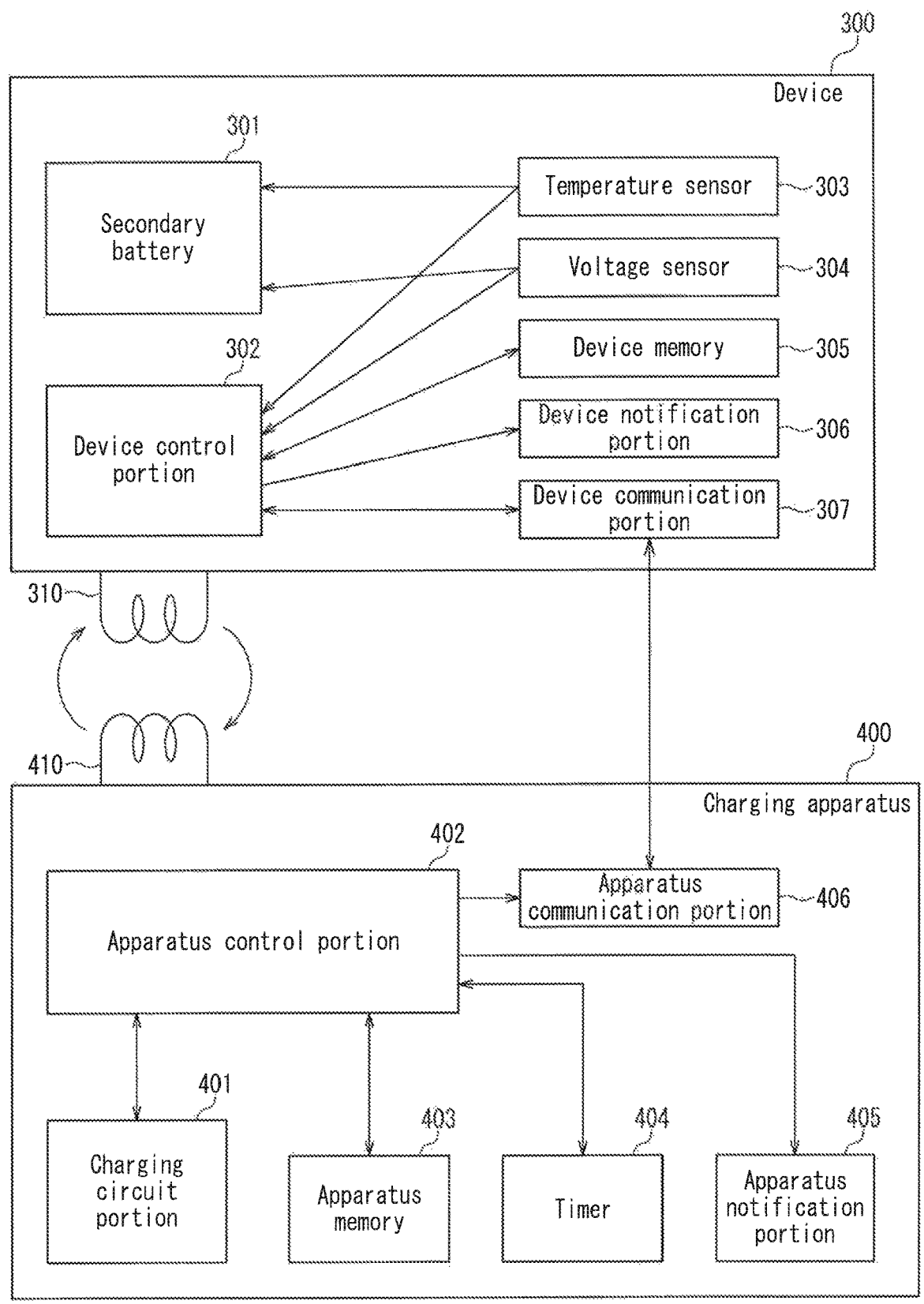
FIG. 3 is a block diagram illustrating a configuration example of a charging mechanism when a lithium ion secondary battery is used as a power source of a hearing aid.

FIG. 3 is a block diagram illustrating an example of the device configuration when a lithium ion secondary battery is used as a power source of a hearing aid, as described in this embodiment.

In the device configuration of FIG. 3, a lithium ion secondary battery 301 is contained in a hearing aid, which is referred to as a device 300. The hearing aid, i.e., the electronic equipment powered by the lithium ion secondary battery is used continuously for a certain period of time by a user. Therefore, if the power supply from the lithium ion secondary battery is stopped to prevent the operation of the hearing aid during the continuous use, such a failure may lead to a serious situation that would threaten the safety of the user. The hearing aid (device 300) is designed so that the user cannot remove the secondary battery 301 from the hearing aid. Moreover, the hearing aid (device 300) is in one-to-one correspondence with a charging apparatus 400 for charging the hearing aid.

For convenience to the user, the device 300 and the charging apparatus 400 have a power receiving coil 310 and a power feeding coil 410, respectively. The power receiving coil 310 and the power feeding coil 410 can supply electric power each other in a noncontact manner. Therefore, in order to charge the secondary battery 301 in the hearing aid, the user only puts the hearing aid on or in a predetermined location while the user does not use the hearing aid, e.g., during sleep.

Thus, the configuration example of FIG. 3 takes into account the strong correspondence between the device 300 containing the secondary battery 301 and the charging apparatus 400 containing a charging circuit portion 401.

As illustrated in FIG. 3, the hearing aid (device 300) includes the secondary battery 301 that is a power source, and a device control portion 302 that controls the whole operation of the hearing aid. The device control portion 302 serves as a control portion of the charging mechanism for the lithium ion secondary battery, and also controls the operation of the hearing aid (device 300). The device control portion 302 may be, e.g., a microcomputer.

In the hearing aid illustrated in FIG. 3, since the charging from the charging apparatus 400 is performed in a noncontact manner, the charging apparatus 400 does not come into contact with the secondary battery 301 in the device 300. Therefore, a temperature sensor 303 for monitoring the temperature of the secondary battery 301, and a voltage sensor 304 for monitoring the voltage value of the secondary battery 301 are located in the device 300.

The device 300 further includes a device memory 305 that stores, e.g., the ID information and the number of charged times CT of the secondary battery 301. The device 300 also includes a device notification portion 306 that displays information when the secondary battery 301 causes an abnormality or reaches the end of its life. Moreover, the device 300 includes a device communication portion 307 that allows predetermined control signals and the stored data to be exchanged between the device 300 and the charging apparatus 400 independently of the exchange of electric power between the power receiving coil 310 and the power feeding coil 410.

On the other hand, the charging apparatus 400 includes the charging circuit portion 401, an apparatus control portion 402, an apparatus memory 403, a timer 404, an apparatus notification portion 405, and an apparatus communication portion 406. The charging circuit portion 401 supplies charging power from the power feeding coil 410 to the power receiving coil 310. The apparatus control portion 402 controls the whole of the charging apparatus 400, and functions as a control portion of the charging mechanism while exchanging information with the device 300 as needed. The apparatus memory 403 stores predetermined information such as the number of charged times CT of the secondary battery. The timer 404 calculates an elapsed time t as a charging interval of the lithium ion secondary battery 301 to be charged. The apparatus notification portion 405 notifies, e.g., the charging state, the abnormality, and the end of the life of the secondary battery 301. The apparatus communication portion 406 is controlled by the apparatus control portion 402 so as to exchange information with the device communication portion 307 in the device 300.

As illustrated in FIG. 3, the component blocks of the charging mechanism of this embodiment are appropriately distributed in both the device 300 (hearing aid) and the charging apparatus 400. With this configuration, the charging mechanism can perform the charging operation and the battery life estimation operation, as described with reference to the flow chart in FIG. 2.

In FIG. 3, the timer 404 may also be located in the device 300 rather than in the charging apparatus 400. However, the device 300 is the hearing aid, and therefore is more strongly required to be small and light weight. Thus, if the components (such as the timer 404) can be located in both the device 300 and the charging apparatus 400, it is more practical to dispose them in the charging apparatus 400. This is because there is a relatively small demand for a reduction in the size and weight of the charging apparatus 400, and the charging apparatus 400 is not likely to have a problem in providing a power source, since the use of a commercial power source is expected.

In the example of the hearing aid (see FIG. 3), the second battery 301 in the device 300 is charged by a wireless power supply method. In order to charge the secondary battery 301, the device 300 and the charging apparatus 400 may be connected by wires. Moreover, it is also possible to appropriately switch between wireless power supply and wire power supply. The communications between the device communication portion 307 and the apparatus communication portion 406 may use either or both of a wire means and a wireless means.

Figure 4:
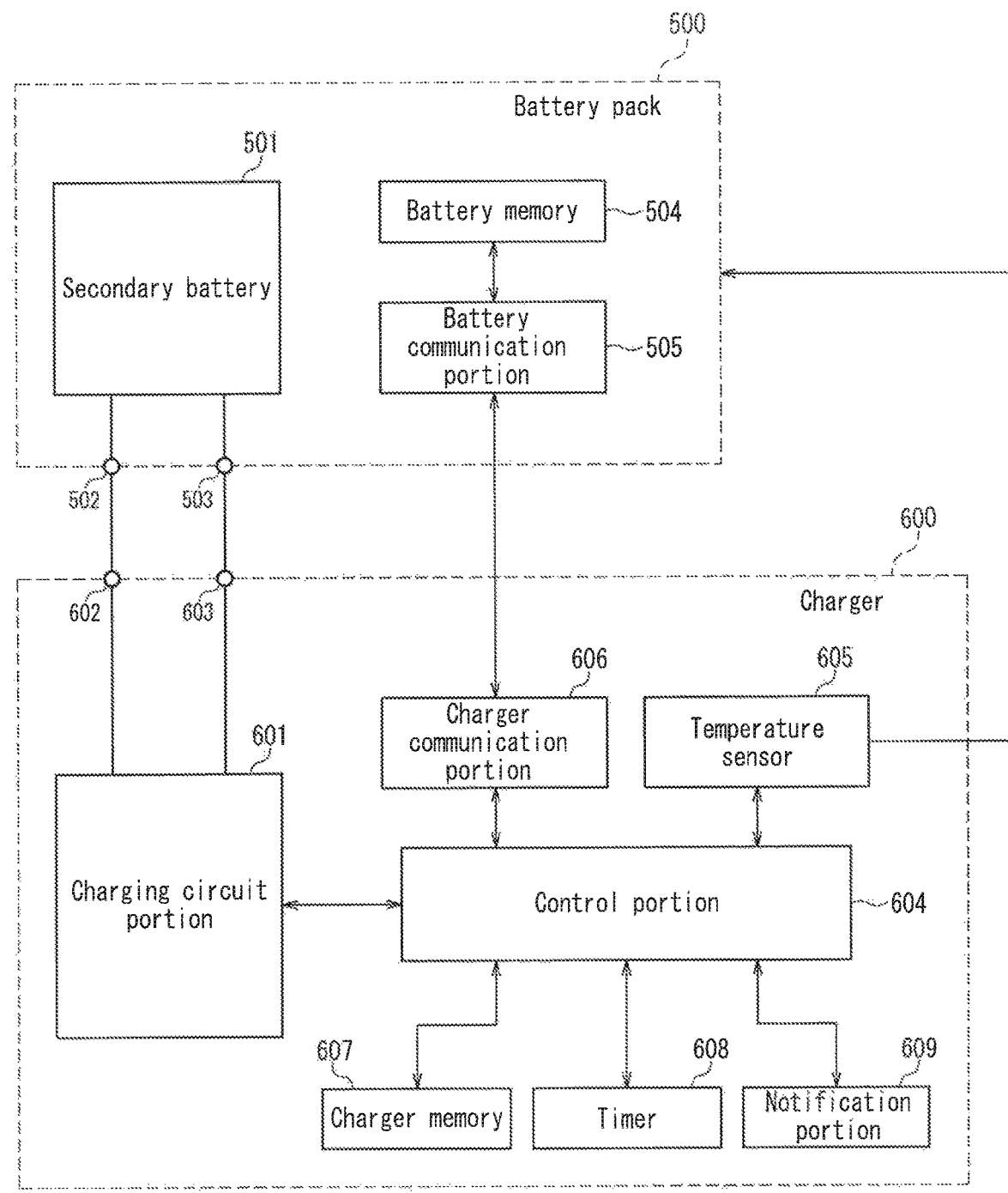
FIG. 4 is a block diagram illustrating a configuration example of a charging mechanism when a lithium ion secondary battery is used as a secondary battery in a battery pack that is a power source of portable electronic equipment.

Next, FIG. 4 is a block diagram illustrating an example of the arrangement of components in a battery pack and a charger for charging the battery pack. In FIG. 4, a lithium ion secondary battery to be charged is provided in the battery pack, which is used in portable electronic equipment such as a portable telephone or a notebook computer. The main portions of the charging mechanism for a lithium ion secondary battery of this embodiment are arranged in the charger.

Unlike the configuration in which the lithium ion secondary battery is contained in the hearing aid (device 300), as illustrated in FIG. 3, a battery pack 500 used as a power source of portable electronic equipment is relatively easily replaced. Therefore, the number of components mounted in the battery pack 500 other than the secondary battery 501 should be as small as possible. In order to charge the battery pack 500, the battery pack 500 may be removed from the electronic equipment and charged by a charging apparatus. Alternatively, the battery pack 500 may be charged while it is placed in the portable electronic equipment, e.g., by connecting a charging cord from a charging apparatus to the battery pack 500.

For example, when the electronic equipment uses a plurality of battery packs 500 in combination, there may be no correspondence between the battery pack 500 and a charger 600.

Under these circumstances, as illustrated in FIG. 4, the battery pack 500 includes only the lithium ion secondary battery 501, a battery memory 504, and a battery communication portion 505. The battery memory 504 stores the number of charged times CT of the lithium ion secondary battery 501. The battery communication portion 505 can transmit the information stored in the battery memory 504 to the charger 600 as needed, and receive the information from the charger 600. The additional function of the battery communication portion 505 is that it can handle the reading and writing of data from and to the battery memory 504.

The charger 600 includes a charging circuit portion 601 and a control portion 604. The charging circuit portion 601 supplies electric power to charge the lithium ion secondary battery 501 from charging terminals 602, 603, which are connected to charging terminals 502, 503 of the battery pack 500, respectively. The charging circuit portion 601 also detects a voltage value and a charging current value of the lithium ion secondary battery 501. The control portion 604 controls the charging circuit portion 601 so as to perform charging. Moreover, as illustrated in FIG. 4, the charger 600 includes a temperature sensor 605, a charger communication portion 606, a charger memory 607, a timer 608, and a notification portion 609. The temperature sensor 605 comes into contact with the battery pack 500 to detect the temperature of the secondary battery 501 during the charging. The charger communication portion 606 allows the information stored in the battery memory 504 to be exchanged with the control portion 604 via the battery communication portion 505 in the battery pack 500. The charger memory 607 stores predetermined information in the charger 600. The timer 608 measures an elapsed time as a charging interval. The notification portion 609 notifies a user of a variety of information such as the charging state, the abnormality, and the life of the lithium ion secondary battery 501.

With this configuration, the battery pack 500 includes the minimum number of components, while the charger 600 includes the main components that control the charging of the battery pack 500. Thus, the charging mechanism for a lithium ion secondary battery of this embodiment is established when the battery pack 500 is charged by the charger 600. The charging mechanism can perform the charging operation and the battery life estimation operation, as described with reference to the flow chart in FIG. 2.

The configuration examples of FIGS. 3 and 4 are merely for illustrative purposes, and the battery pack for a hearing aid or portable electronic equipment may have any configuration other than those illustrated in FIGS. 3 and 4. The charging mechanism of this embodiment is divided into two members, as illustrated in FIGS. 3 and 4. However, the arrangement of the charging mechanism is not limited thereto. For example, when electronic equipment includes a lithium ion secondary battery as a power source and all components for charging the lithium ion secondary battery, the entire charging mechanism should be provided in the electronic equipment. Consequently, this configuration eliminates the communication portions for information transmission between the two devices (see FIGS. 3 and 4), and can achieve a charging mechanism with a simpler configuration. Further, there is another example in which the components of the charting mechanism of this embodiment may be distributed to three or more devices. In such a case, the charging circuit portion, which requires electric power for charging the lithium ion secondary battery, may be separated from the control portion and contained in a device that can use a commercial power source.

As described above, in the charging control method and the charging mechanism for a lithium ion secondary battery of this embodiment, even if the lithium ion secondary battery maintains a high voltage for a predetermined time, this can be converted into the number of charged times (i.e., the indicator of the battery life), so that the life of the lithium ion secondary battery can be estimated by reflecting the number of charged times in accordance with the life characteristics of the lithium ion secondary battery. Thus, the charging control method and the charging mechanism can perform a more accurate estimation of the life that corresponds to the actual state of use of the lithium ion secondary battery only by means of a simple configuration using the number of charged times as an indicator.

INDUSTRIAL APPLICABILITY

The charging control method for a lithium ion secondary battery and the charging mechanism for a lithium ion secondary battery of the present disclosure have a simple configuration, but can perform a more accurate estimation of the life that reflects the degradation factors inherent in the lithium ion secondary battery. Therefore, the present disclosure is useful for a charging control method and a charging mechanism for a lithium ion secondary battery that is widely used as a power source of electronic equipment.

In particular, when a lithium ion secondary battery is used as a power source of equipment that is assumed to be used continuously and requires charging control based on an accurate decision on the life of the lithium ion secondary battery, including, e.g., a medical assistive device such as a hearing aid, the present disclosure is very useful for a charging control method and a charging mechanism that control the charging of the lithium ion secondary battery.

DESCRIPTION OF REFERENCE NUMERALS

100 Lithium ion secondary battery
101 Battery body
200 Charging mechanism for lithium ion secondary battery
201 Charging circuit portion (voltage detector)
204 Control portion
207 Memory
208 Timer

The invention claimed is:

1. A charging control method for a lithium ion secondary battery that calculates an integrated value of a number of charged times,
the method comprising:
adding a predetermined value to the integrated value of the number of charged times of the lithium ion secondary battery if both a residual voltage that is a voltage value of the lithium ion secondary battery before beginning of charging and an elapsed time from a time of previous charging of the lithium ion secondary battery are not less than predetermined values; and
estimating a life of the lithium ion secondary battery based on the integrated value of the number of charged times.

2. A charging mechanism for a lithium ion secondary battery, comprising:
a charging circuit portion;
a voltage detector that detects a voltage of a lithium ion secondary battery to be charged;
a memory that stores an integrated value of a number of charged times of the lithium ion secondary battery;
a timer that measures an elapsed time from an end of previous charging of the lithium ion secondary battery; and
a control portion that controls the charging circuit portion, the voltage detector, the memory, and the timer,
wherein the control portion adds a predetermined value to the integrated value of the number of charged times if both a residual voltage of the lithium ion secondary battery before beginning of charging, which is detected by the voltage detector, and the elapsed time measured by the timer are not less than predetermined values, and the control portion estimates a life of the lithium ion secondary battery based on the integrated value of the number of charged times.

3. The charging mechanism according to claim 2, wherein the control portion increases the number of charged times by 0.5 if both the residual voltage and the elapsed time are not less than predetermined values.

4. The charging mechanism according to claim 2, further comprising:
a temperature detector that detects a temperature of the lithium ion secondary battery,
wherein the control portion increases the number of charged times by 1 if the temperature of the lithium ion secondary battery during charging is not less than a predetermined temperature.

5. The charging mechanism according to claim 2, wherein the control portion notifies a user that the lithium ion secondary battery is approaching an end of its life if the integrated value of the number of charged times is more than a predetermined warning value.

6. The charging mechanism according to claim 2, wherein the control portion notifies a user that the lithium ion secondary battery reaches the end of its life and does not perform charging if the integrated value of the number of charged times is more than a predetermined threshold value.

7. The charging mechanism according to claim 2, wherein using a device powered by the lithium ion secondary battery and a charger for charging the lithium ion secondary battery,
at least a part of the voltage detector, at least a part of the memory, and at least a part of the control portion are arranged along with the lithium ion secondary battery in the device,
portions of the charging mechanism other than the portions arranged in the device are arranged in the charger, and
information can be exchanged between the device and the charger.

8. The charging mechanism according to claim 7, wherein the device is a hearing aid, and electric power is supplied in a noncontact manner between the hearing aid and the charger.

* * * * *